(12) United States Patent
Kobayashi et al.

(10) Patent No.: US 7,932,558 B2
(45) Date of Patent: Apr. 26, 2011

(54) SEMICONDUCTOR DEVICE AND METHOD FOR MANUFACTURING THE SAME

(75) Inventors: Yasushi Kobayashi, Toyama (JP); Manabu Imahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/424,119

(22) Filed: Apr. 15, 2009

(65) Prior Publication Data

US 2009/0267144 A1 Oct. 29, 2009

(30) Foreign Application Priority Data

Apr. 28, 2008 (JP) ................. 2008-116953

(51) Int. Cl.
*H01L 29/76* (2006.01)
*H01L 31/062* (2006.01)

(52) U.S. Cl. ........ 257/335; 257/336; 257/401; 257/492; 438/286

(58) Field of Classification Search .......... 257/335–336, 257/401, 492, E29.114, E29.112; 438/284, 438/286

See application file for complete search history.

(56) References Cited

U.S. PATENT DOCUMENTS

| 5,517,046 | A | * | 5/1996 | Hsing et al. ........... 257/336 |
| 5,917,217 | A | | 6/1999 | Kitamura et al. |
| 5,981,997 | A | | 11/1999 | Kitamura |
| 6,448,625 | B1 | | 9/2002 | Hossain et al. |
| 2006/0199344 | A1 | | 9/2006 | Tanaka |

FOREIGN PATENT DOCUMENTS

JP 09-260651 10/1997

* cited by examiner

*Primary Examiner* — Theresa T Doan
(74) *Attorney, Agent, or Firm* — McDermott Will & Emery LLP

(57) ABSTRACT

A semiconductor device includes: an n-type first well diffusion layer; an n-type second well diffusion layer; a p-type source diffusion layer; a p-type third well diffusion layer; a p-type drain diffusion layer; a gate insulating film; a gate electrode; a device isolation insulating film; and a buffer layer. The buffer layer is formed between the first well diffusion layer and the third well diffusion layer to be in contact with an end of the third well diffusion layer opposing the source diffusion layer, and extends from immediately below the gate insulating film to a position deeper than a peak of curvature of impurity concentration distribution of the third well diffusion layer. The buffer layer has an impurity concentration lower than an impurity concentration in the third well diffusion layer.

7 Claims, 6 Drawing Sheets

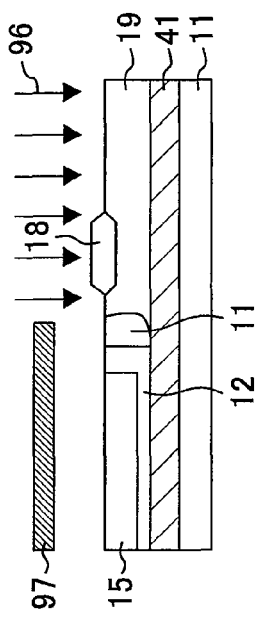
FIG. 9A
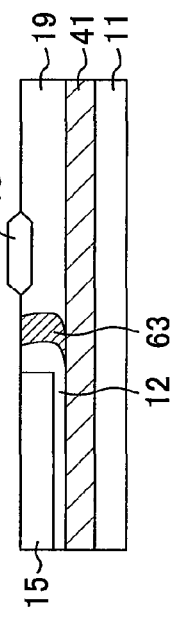
FIG. 9B
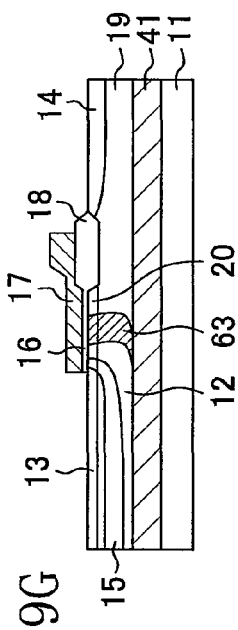
FIG. 9E
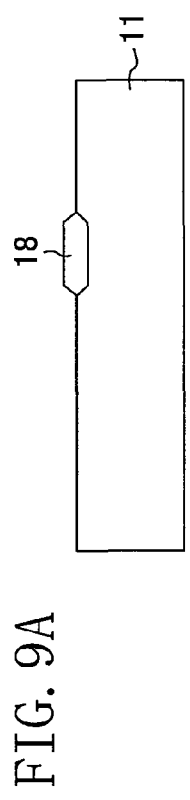
FIG. 9C
FIG. 9F
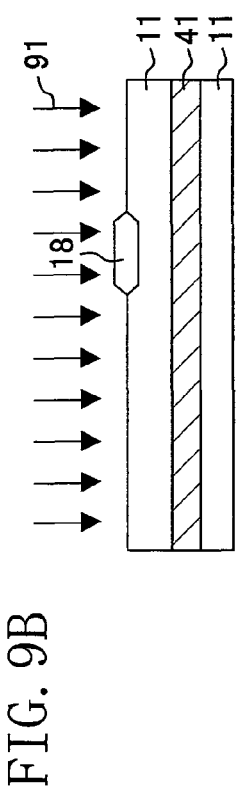
FIG. 9D
FIG. 9G
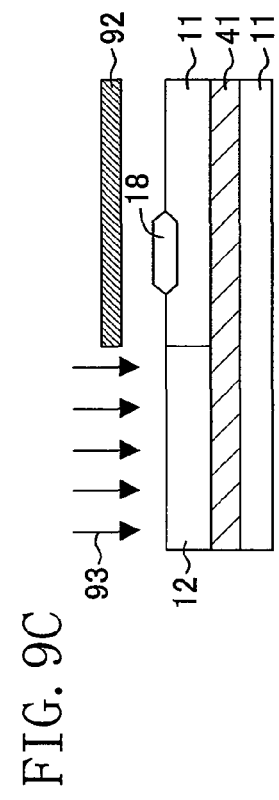
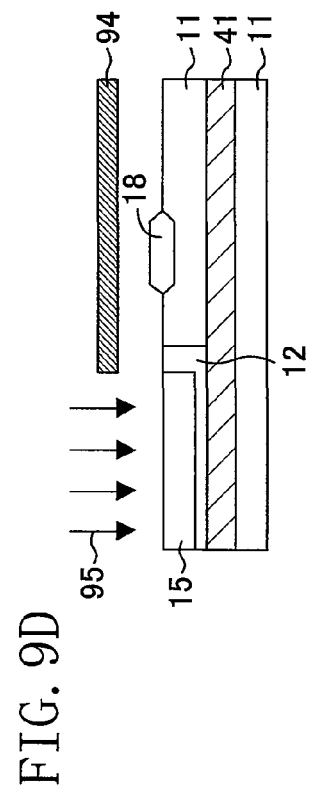

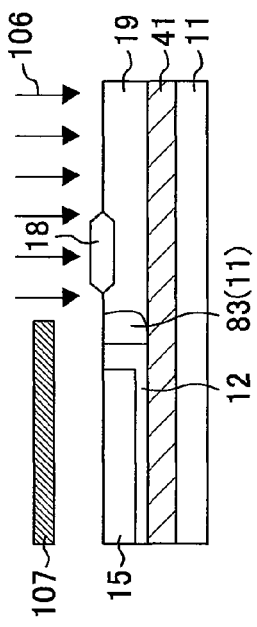
FIG. 10A
FIG. 10B
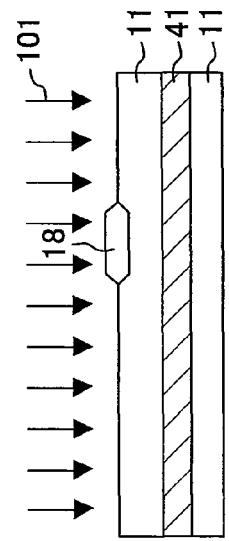
FIG. 10C
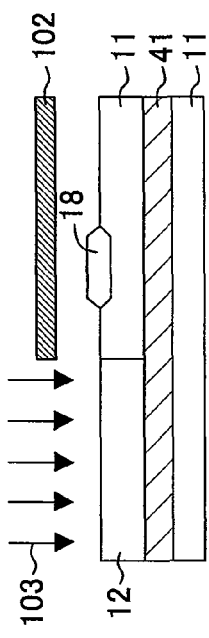
FIG. 10D
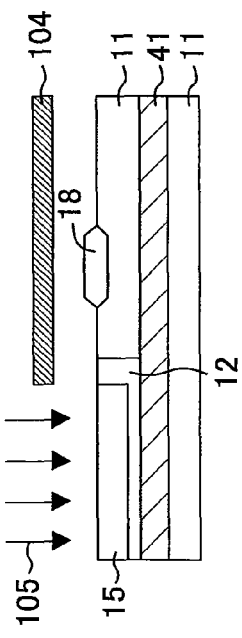
FIG. 10E
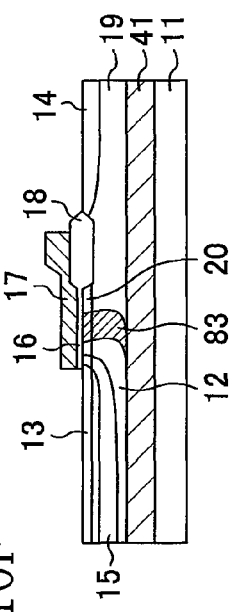
FIG. 10F

SEMICONDUCTOR DEVICE AND METHOD FOR MANUFACTURING THE SAME

CROSS-REFERENCE TO RELATED APPLICATION

This application claims priority from Japanese Patent Application No. 2008-116953 filed on Apr. 28, 2008, the disclosure of which application is hereby incorporated by reference in its entirety for all purposes.

BACKGROUND OF THE INVENTION

A technology disclosed in this specification relates to semiconductor devices, in particular to the structure of a high breakdown voltage MOS semiconductor device.

With increase in packing density of semiconductor integrated circuit devices in recent years, there is a growing demand for semiconductor integrated circuit devices including high breakdown voltage MOS elements, low breakdown voltage CMOS elements, and bipolar elements integrated on the same substrate. The high breakdown voltage MOS elements are required to have high breakdown voltage, low ON resistance, and low threshold voltage. The low ON resistance of the high breakdown voltage MOS element allows reduction in chip size. The low threshold voltage allows increase in margin for driving voltage and reduction in power consumption.

Conventionally, to achieve the high breakdown voltage MOS semiconductor devices, a technique of improving the breakdown voltage by forming an electric field relaxation layer in a drain region of the high breakdown voltage MOS element has been used. However, the electric field relaxation layer formed in the drain region acts as a resistance component when the transistor is operating. As a result, ON resistance per unit area of the element is increased. As such, there is a trade-off between the breakdown voltage and the ON resistance.

To cope with the trade-off problem, for example, Published Japanese Patent Application No. H09-260651 describes a technique of forming two offset regions as the electric field relaxation layer in a drain region of a high breakdown voltage MOS element for the purpose of achieving both improvement in breakdown voltage and reduction in ON resistance.

FIG. 11 is a cross-sectional view illustrating a conventional high breakdown voltage MOS transistor.

As shown in FIG. 11, the conventional high breakdown voltage MOS transistor includes: a p-type substrate 201; an n-type well region 202 formed in an upper portion of the substrate 201; an n-type base region 205 formed in an upper portion of the n-type well region 202; a p-type source region 203 formed in an upper portion of the n-type base region 205; a second p-type offset region 210 formed in an upper portion of the n-type well region 202; a first p-type offset region 206 formed in an upper portion of the second p-type offset region 210; a LOCOS oxide film 209 formed on the substrate 201; a gate oxide film 207 formed on the p-type source region 203, the n-type base region 205, the substrate 201 and the first p-type offset region 206 and connected to the LOCOS oxide film 209 at an end thereof; a gate electrode 208 formed on the gate oxide film 207; and a p-type drain region 204 formed in an upper portion of the first p-type offset region 206.

A surface impurity concentration of the first p-type offset region 206 is low, and an end thereof opposing the p-type source region 203 is closer to the p-type source region 203 than the second p-type offset region 210. The first p-type offset region 206 and the second p-type offset region 210 constitute a double offset region covering the bottom of the p-type drain region 204. The conventional high breakdown voltage MOS transistor is a lateral field-effect transistor configured as described above.

In this structure, part of the double offset region as a drain drift layer, i.e., part of the first p-type offset region 206 protruding toward the p-type source region 203, easily goes into a depletion state. On the other hand, part of the double offset region where the two offset regions overlap each other is less likely to go into the depletion state, and a reach through breakdown voltage is improved. In the double offset region, in particular when the first p-type offset region 206 which is lower in surface impurity concentration protrudes toward the p-type source region 203 more than the second p-type offset region 210 having higher surface impurity concentration, the first p-type offset region 206 is more likely to go into the depletion state, the second p-type offset region 210 having higher surface impurity concentration is less likely to go into the depletion state, and the reach through breakdown voltage is improved. Further, part of the gate oxide film 207 below part of the gate electrode 208 close to the p-type drain region 204 is thick. Therefore, an electric field below the thick part of the insulating film is relaxed, and the reach through breakdown voltage is easily enhanced.

As described above, in the conventional high breakdown voltage MOS transistor, provision of the first p-type offset region 206 and the second p-type offset region 210 allows relaxation of an electric field generated in the drain region, improvement in breakdown voltage, and reduction in resistance of a drift region. That is, both of improvement in breakdown voltage and reduction in ON resistance are achieved.

SUMMARY OF THE INVENTION

In order to reduce the threshold voltage in the conventional high breakdown voltage MOS transistor, an impurity concentration in a well diffusion layer below the gate electrode 208 has to be lowered. However, when the impurity concentration of the well diffusion layer is lowered, punch through occurs between the source and the drain, and the breakdown voltage is considerably reduced.

To cope with this drawback, as shown in FIG. 12, a P-type surface region 311 can be formed in a surface portion of the n-type well region 202 below the gate electrode 208. However, when the P-type surface region 311 is formed in the whole surface portion covered with the gate electrode 208, an impurity concentration is increased in a bird's beak portion of the LOCOS oxide film 209 at an end thereof opposing the p-type source region 203. As a result, the ON resistance is reduced, but an electric field is concentrated at the end of the LOCOS oxide film, resulting in reduction in breakdown voltage.

FIG. 13 is a cross-sectional view of a variant of the conventional high breakdown voltage MOS transistor of FIG. 12, illustrating equipotential lines and a location of electric field concentration near a boundary between the n-type well region 202 and the second p-type offset region 210. In the conventional structure, the first p-type offset region 206, the second p-type offset region 210, and the P-type surface region 311 overlap each other at the end of the LOCOS oxide film 209 opposing the source. Therefore, the impurity concentration at the overlapping part is higher than the other part in the offset regions. Therefore, the electric field is likely to concentrate at this position, and the equipotential lines become dense. In the conventional structure, when the threshold voltage is reduced on one hand, the electric field concentration brings about reduction in breakdown voltage on the other hand. Even when the P-type surface region 311 and the first p-type offset region 206 are formed not to overlap with each other using different masks, so as to avoid the reduction in breakdown voltage caused by the electric field concentration at the end of the LOCOS oxide film 209, i.e., so as not to increase the impurity concentration in the bird's beak portion, the reduction in breakdown voltage may occur due to mask misalignment, and the ON resistance and the threshold voltage may vary. This problem was first discovered by the inventors of the present application.

A semiconductor device and a method for manufacturing the same disclosed by the present specification allow providing a MOS semiconductor device which achieves reduction in threshold voltage, improvement in breakdown voltage and reduction in ON resistance.

A first example semiconductor device of the present invention includes: a semiconductor substrate; a first well diffusion layer of the first conductivity type formed in an upper portion of the semiconductor substrate; a second well diffusion layer of the first conductivity type formed in an upper portion of the first well diffusion layer; a source diffusion layer of a second conductivity type formed in an upper portion of the second well diffusion layer; a third well diffusion layer of the second conductivity type formed in an upper portion of the semiconductor substrate to be positioned away from the second well diffusion layer; a drain diffusion layer of the second conductivity type formed in an upper portion of the third well diffusion layer; a gate insulating film formed on the second well diffusion layer, the first well diffusion layer, and the third well diffusion layer; a gate electrode formed on the gate insulating film; a device isolation insulating film formed on the third well diffusion layer and between the gate insulating film and the drain diffusion layer to be connected to the gate insulating film; and a buffer layer of the second conductivity type formed between the first well diffusion layer and the third diffusion layer to be in contact with an end of the third well diffusion layer opposing the source diffusion layer and extends from immediately below the gate insulating film to a position deeper than a peak of curvature of impurity concentration distribution of the third well diffusion layer, the buffer layer of the second conductivity type having an impurity concentration lower than an impurity concentration in the third well diffusion layer.

In this structure, the buffer layer is formed on the source side of the third diffusion layer. Therefore, potential distribution in the semiconductor layer can be changed, the electric field concentrated at around the end of the device isolation insulating film opposing the source diffusion layer can be relaxed, and the location of electric field concentration can be shifted. This allows improvement in breakdown voltage as compared with the conventional semiconductor device. Further, reduction in ON resistance and threshold voltage can also be achieved.

With the presence of the low concentration buffer layer having a width not smaller than a margin for mask misalignment, variations in breakdown voltage due to mask misalignment can be suppressed.

A second example semiconductor device of the present invention includes: a semiconductor substrate; a first well diffusion layer of a first conductivity type formed in an upper portion of the semiconductor substrate; a second well diffusion layer of the first conductivity type formed in an upper portion of the first well diffusion layer; a source diffusion layer of a second conductivity type formed in an upper portion of the second well diffusion layer; a third well diffusion layer of the second conductivity type formed in an upper portion of the semiconductor substrate to be positioned away from the second well diffusion layer, and forms a PN junction with the first well diffusion layer; a drain diffusion layer of the second conductivity type formed in an upper portion of the third well diffusion layer; a gate insulating film formed on the second well diffusion layer, the first well diffusion layer, and the third well diffusion layer; a gate electrode formed on the gate insulating film; a device isolation insulating film formed on the third well diffusion layer and between the gate insulating film and the drain diffusion layer to be connected to the gate insulating film; and a buried diffusion layer of the first conductivity type formed in part of the semiconductor substrate in contact with the bottoms of the first well diffusion layer and the third well diffusion layer.

Also in this structure, like in the first example semiconductor device, the electric field concentrated at around the end of the device isolation insulating film opposing the source diffusion layer can be relaxed. This allows improvement in breakdown voltage as compared with the conventional semiconductor device. Further, reduction in ON resistance and threshold voltage can also be achieved.

An example method for manufacturing a semiconductor device of the present invention includes: (a) forming a first well diffusion layer by selectively implanting impurity ions of a first conductivity type into a first region of a semiconductor substrate on which a device isolation insulating film has been formed; (b) forming a second well diffusion layer by selectively implanting impurity ions of the first conductivity type into at least an upper portion of the first well diffusion layer; (c) forming a third well diffusion layer in part of the semiconductor substrate away from the first well diffusion layer by selectively implanting impurity ions of a second conductivity type into a second region of the semiconductor substrate different from the first region; (d) forming a buffer layer of the second conductivity type in part of the semiconductor substrate between the first well diffusion layer and the third well diffusion layer to extend from a surface portion of the semiconductor substrate to a position deeper than a peak of curvature of impurity concentration distribution of the third well diffusion layer; (e) forming a gate insulating film and a gate electrode sequentially on the second well diffusion layer and the third well diffusion layer by implanting impurity ions of the second conductivity type; and (f) forming a source diffusion layer in an upper portion of the second well diffusion layer and forming a drain diffusion layer in an upper portion of the third well diffusion layer by implanting impurity ions of the second conductivity type into upper portions of the second well diffusion layer and the third well diffusion layer.

This method allows manufacturing a high breakdown voltage MOS transistor.

BRIEF DESCRIPTION OF THE DRAWINGS

FIGS. 9A to 9G are cross-sectional views illustrating the processes of manufacturing the semiconductor device of Embodiment 3.

FIGS. 10A to 10F are cross-sectional views illustrating the processes of manufacturing the semiconductor device of Embodiment 4.

DETAILED DESCRIPTION OF THE INVENTION

Embodiment 1

Figure 1:
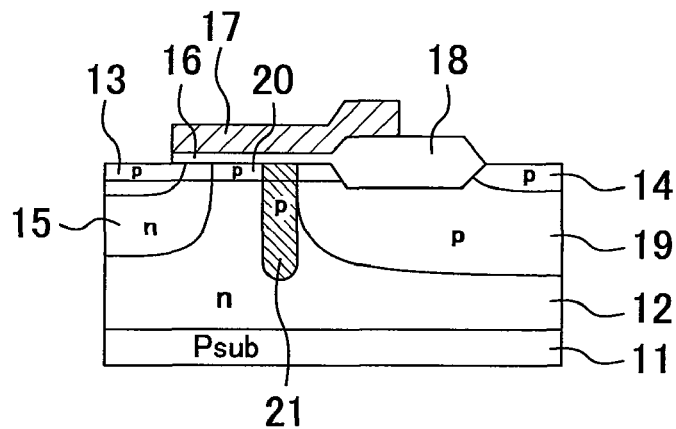
FIG. 1 is a cross-sectional view illustrating a principle part of a high breakdown voltage P-channel MOS transistor which is a semiconductor device according to Embodiment 1 of the present invention.

Hereinafter, a semiconductor device according to Embodiment 1 of the present invention will be described with reference to the accompanying drawings. FIG. 1 is a cross-sectional view illustrating a principle part of a high breakdown voltage P-channel MOS transistor which is a semiconductor device according to Embodiment 1 of the present invention.

As shown in FIG. 1, the semiconductor device of Embodiment 1 includes: a p-type substrate 11 made of a semiconductor such as silicon, or the like; an N⁻-type well diffusion layer (a first well diffusion layer) 12 formed in an upper portion of the substrate 11; an N⁻-type well diffusion layer (a second N⁻-type well diffusion layer) 15 formed in an upper portion of the N⁻-type well diffusion layer 12; a P⁺-type source diffusion layer 13 formed in an upper portion of the N⁻-type well diffusion layer 15; a low concentration P⁻-type diffusion layer (a third well diffusion layer) 19 formed in an upper portion of the N⁻-type well diffusion layer 12 (or the substrate 11) with a channel region formed in an upper portion of the N⁻-type well diffusion layer 12 sandwiched between the P⁻-type diffusion layer 19 and the N⁻-type well diffusion layer 15; a P-type surface diffusion layer 20 formed in the upper portions of the P⁺-type source diffusion layer 13, the N⁻-type well diffusion layer 15, the N⁻-type well diffusion layer 12, and an end of the low concentration P⁻-type diffusion layer 19; a LOCOS oxide film (a device isolation insulating film) 18 formed on the substrate 11; a P⁺-type drain diffusion layer 14 formed in an upper portion of the low concentration P⁻-type diffusion layer 19 and isolated from the P-type surface diffusion layer 20 by the LOCOS oxide film 18; a gate oxide film (a gate insulating film) 16 formed on the P-type surface diffusion layer 20; and a gate electrode 17 formed on the gate oxide film 16. The low concentration P⁻-type diffusion layer 19 is provided to relax an electric field, and an end thereof is located below the gate oxide film 16.

An end of the gate oxide film 16 close to the P⁺-type drain diffusion layer 14 is thicker than the other part thereof. Therefore, an electric field below the thick part of the insulating film is relaxed, and a reach through breakdown voltage is easily enhanced.

The semiconductor device of Embodiment 1 further includes a low concentration P⁻-type buffer diffusion layer (a buffer layer) 21 which is in contact with an end of the low concentration P⁻-type diffusion layer 19 for electric field relaxation opposing the source, and has an impurity concentration sufficiently lower than that of the low concentration P⁻-type diffusion layer 19. The low concentration P⁻-type buffer diffusion layer 21 is formed to extend from the P-type surface diffusion layer 20 below the gate electrode 17 to the N⁻-type well diffusion layer 12 below the P-type surface diffusion layer 20 to reach at least a position deeper than a peak of curvature of impurity concentration distribution of the low concentration P⁻-type diffusion layer 19.

After the N⁻-type well diffusion layer 12 and the low concentration P⁻-type diffusion layer 19 are formed, the low concentration P⁻-type buffer diffusion layer 21 is formed by general photolithography and ion implantation, so that it contacts the source-side end of the low concentration P⁻-type diffusion layer 19, and extends laterally toward the source to have a width of about 0.1 to 1 µm and vertically to a position deeper than the peak of curvature of the low concentration P⁻-type diffusion layer 19. In this case, an impurity concentration of the low concentration P⁻-type diffusion layer 19 is about $2\times10^{16}$ cm⁻³ to $1\times10^{17}$ cm⁻³, for example. On the other hand, the low concentration P⁻-type buffer diffusion layer 21 has an impurity concentration as sufficiently low as about $2\times10^{15}$ cm⁻³ to $1\times10^{16}$ cm⁻³, for example. The low concentration P⁻-type buffer diffusion layer 21 may be formed simultaneously with a P⁻-type well diffusion layer of a low breakdown voltage N-channel MOS transistor which is also formed on the substrate 11. The substrate 11 may be made of an N-type semiconductor, instead of the P-type semiconductor. The N⁻-type well diffusion layer 12 formed by ion implantation to the substrate may be formed by epitaxial growth. In FIG. 1, source and drain electrodes, interlayer insulating films, and protective films are omitted.

Figure 2:
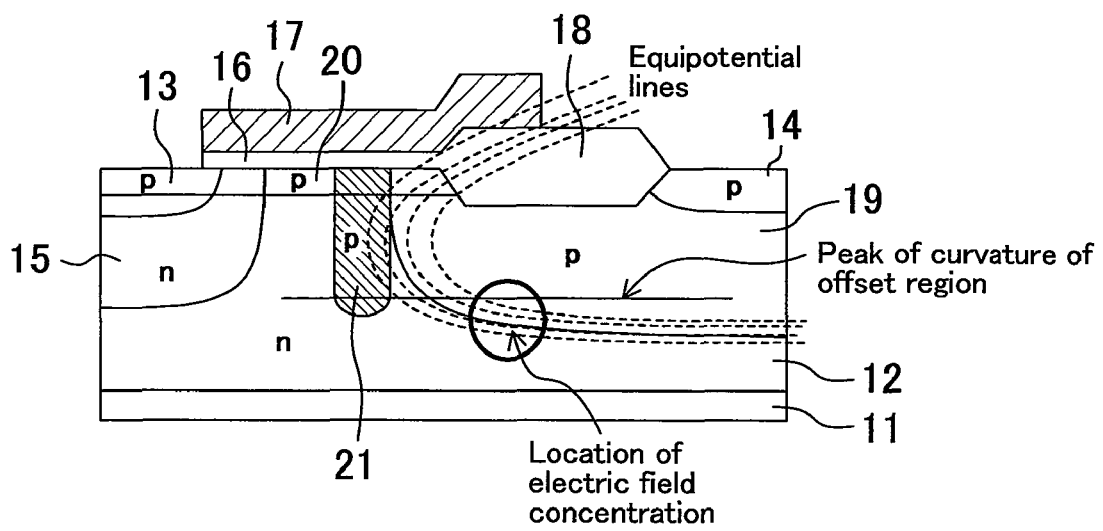
FIG. 2 is a cross-sectional view of the semiconductor device of Embodiment 1, illustrating equipotential lines and a location of electric field concentration near an interface between a low concentration P$^-$-type diffusion layer and other layers.

FIG. 2 is a cross-sectional view of the semiconductor device according to Embodiment 1, illustrating equipotential lines and a location of electric field concentration near an interface between the low concentration P⁻-type diffusion layer 19 and other layers.

In the semiconductor device of Embodiment 1 thus configured, the electric field, which is concentrated at the end of the LOCOS film opposing the p-type source region 203 in the conventional semiconductor device (see FIG. 13), is shifted to a location below the low concentration P⁻-type diffusion layer 19 as shown in FIG. 2 by forming the low concentration P⁻-type buffer diffusion layer 21. This allows improvement in breakdown voltage.

In the conventional structure, curves of the equipotential lines are determined by impurity concentration distribution in the second p-type offset region 210 (corresponding to the low concentration P⁻-type diffusion layer 19). Therefore, peaks of curvature of the equipotential lines come to almost the same position as a peak of curvature of impurity concentration distribution of the second p-type offset region 210 (including the first p-type offset region 206 formed therein).

Figure 13:
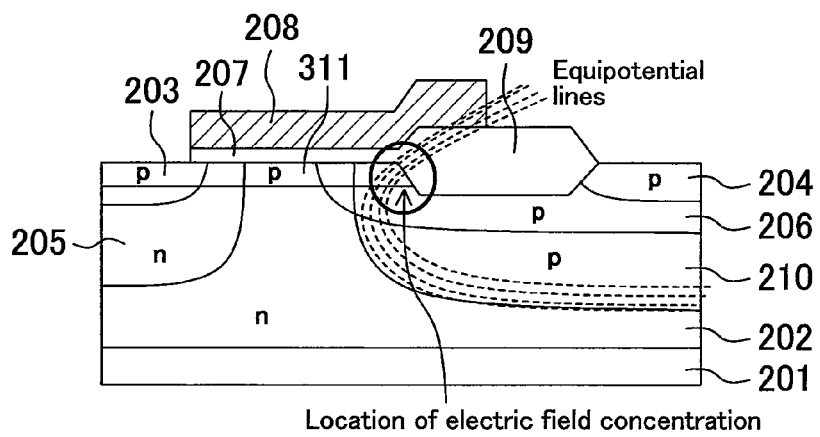
FIG. 13 is a cross-sectional view of the conventional high breakdown voltage MOS transistor, illustrating equipotential lines and a location of electric field concentration near a boundary between an n-type well region and a second p-type offset region.

In contrast, as understood from comparison between FIGS. 2 and 13, in the semiconductor device of Embodiment 1, the low concentration P⁻-type buffer diffusion layer 21 is formed to be in contact with the source-side end of the low concentration P⁻-type diffusion layer 19, instead of the first p-type offset region 206 used in the conventional structure. Therefore, the low concentration P⁻-type buffer diffusion layer 21 functions as an electric field relaxation layer, and the electric field concentration at the end of the LOCOS oxide film 18 opposing the P⁺-type source diffusion layer 13 can be relaxed. In particular, in order to make full use of the effect of relaxing the electric field concentration, it is necessary that the low concentration P⁻-type buffer diffusion layer 21 is formed at a position deeper than the peak of curvature of the low concentration P⁻-type diffusion layer 19. In this case, the impurity concentration profile of the lower portion of the low concentration P⁻-type diffusion layer 19 remains unchanged from that in the conventional structure. Therefore, the electric field concentration at the source-side end of the LOCOS film is relaxed and shifted to a location below the low concentration P⁻-type diffusion layer 19. As a result, potential distribution in the drain offset region (the low concentration P⁻-type diffusion layer 19) becomes more uniform than that in the conventional structure, and the breakdown voltage of the semiconductor device is improved. Further, since the low concentration P⁻-type buffer diffusion layer 21 having low p-type impurity concentration is formed to be in contact with the source-side end of the low concentration P⁻-type diffusion layer 19, drift resistance in the drain can be reduced when the transistor is in ON, and the ON resistance can be reduced. Moreover, since the P-type surface diffusion layer 20 is formed in the whole region covered with the bottom surface of the gate oxide film 16, the threshold voltage can be reduced. Even when the location of electric field concentration is shifted to a lower position than the conventional location of electric field concentration, an intensity of the electric field can be less than that of the electric field concentrated at the end of the LOCOS film. Thus, the operation of the semiconductor device is not affected.

As described above, the semiconductor device of Embodiment 1 allows providing a P-channel MOS transistor with reduced threshold voltage, reduced ON resistance, and a good breakdown voltage characteristic.

The structure of the present embodiment can also be applied to the case where the device isolation region is an STI region.

In the semiconductor device of Embodiment 1, the effect of relaxing the electric field concentration can be exhibited even when the conductivity types of all the layers are changed. However, as described later in Embodiment 2, this is not applied to a semiconductor device including a high concentration N-type buried diffusion layer and making use of pushing out of boron by phosphorus.

Further, in the semiconductor device of Embodiment 1, the semiconductor layers containing the impurities are formed by implanting p- or n-type impurity ions into corresponding parts of the substrate 11. However, the N⁻-type well diffusion layer 12, for example, may be formed by epitaxial growth, such as CVD.

Embodiment 2

Hereinafter, a semiconductor device according to Embodiment 2 of the present invention will be described with reference to the accompanying drawings.

Figure 3:
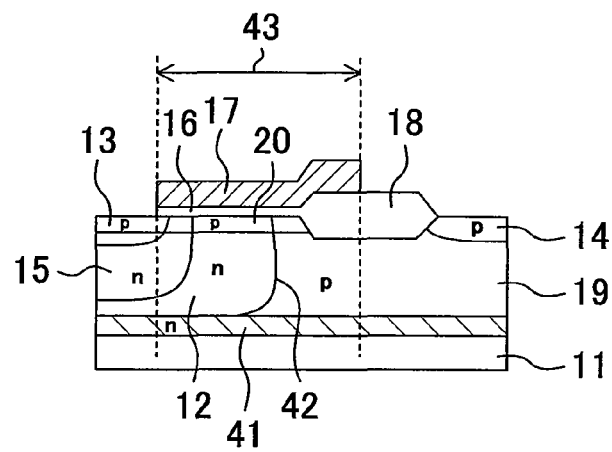
FIG. 3 is a cross-sectional view illustrating a principle part of a high breakdown voltage P-channel MOS transistor which is a semiconductor device according to Embodiment 2 of the present invention.

FIG. 3 is a cross-sectional view illustrating a principle part of a high breakdown voltage P-channel MOS transistor which is the semiconductor device according to Embodiment 2 of the present invention. In FIG. 3, the same components as those of the semiconductor device of Embodiment 1 shown in FIG. 1 are indicated by the same reference numerals.

As shown in FIG. 3, the semiconductor device of Embodiment 2 includes: a p-type substrate 11; an N⁻-type well diffusion layer 12; an N⁻-type well diffusion layer 15; a P⁺-type source diffusion layer 13; a low concentration P⁻-type diffusion layer 19; a P-type surface diffusion layer 20; a LOCOS oxide film 18; a P⁺-type drain diffusion layer 14; a gate oxide film 16; and a gate electrode 17. In the semiconductor device of Embodiment 2, the N⁻-type well diffusion layer 12 is adjacent to the source side of the low concentration P⁻-type diffusion layer 19, and the N⁻-type well diffusion layer 12 and the low concentration P⁻-type diffusion layer 19 form a PN junction.

The semiconductor device of Embodiment 2 further includes a high concentration N-type buried diffusion layer 41 in part of the substrate 11 in contact with the bottoms of the N⁻-type well diffusion layer 12 and the low concentration P⁻-type diffusion layer 19. The high concentration N-type buried diffusion layer 41 has an impurity concentration of about $1 \times 10^{17}$ cm⁻³ to $3 \times 10^{17}$ cm⁻³, for example, which is higher than that of the N⁻-type well diffusion layer 12, and is arranged at least below the gate electrode 17 to have a length not smaller than a width (gate length) 43. The structure of the present embodiment other than this is the same as that of Embodiment 1.

Figure 4:
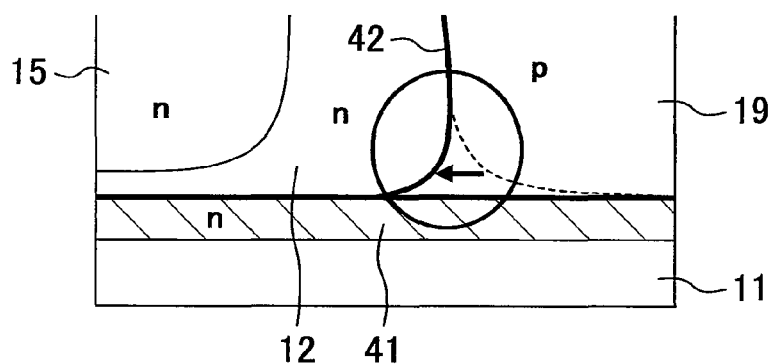
FIG. 4 is a cross-sectional view of the semiconductor device of Embodiment 2, illustrating an enlargement of a region around a boundary of an N⁻-type well diffusion layer, a low concentration P⁻-type diffusion layer, and high concentration N-type buried diffusion layer.
Figure 5:
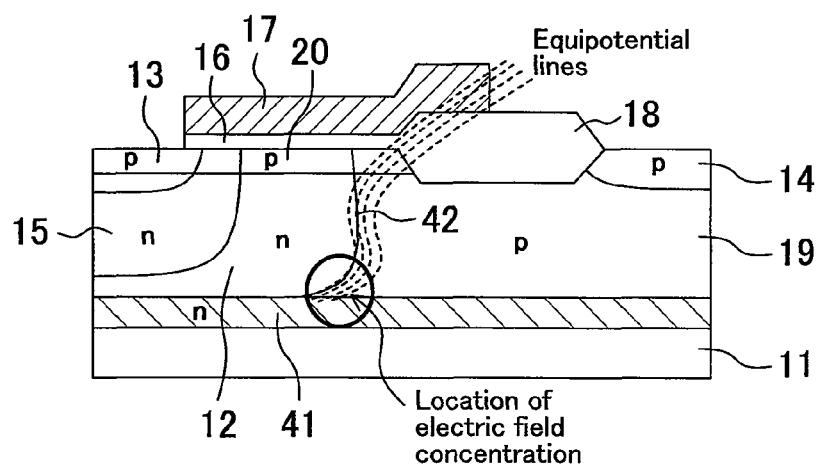
FIG. 5 is a cross-sectional view of the semiconductor device of Embodiment 2, illustrating equipotential lines and a location of electric field concentration near an interface between a low concentration P⁻-type diffusion layer and other layers.

FIG. 4 is a cross-sectional view of the semiconductor device of Embodiment 2, illustrating an enlargement of a region around a boundary of the N⁻-type well diffusion layer 12, the low concentration P⁻-type diffusion layer 19, and the high concentration N-type buried diffusion layer 41. In the semiconductor device of Embodiment 2, the impurity concentration in the low concentration P⁻-type diffusion layer 19 is about $2 \times 10^{16}$ cm⁻³ to $1 \times 10^{17}$ cm⁻³, while the impurity concentration in the high concentration N-type buried diffusion layer 41 is about $1 \times 10^{17}$ cm⁻³ to $3 \times 10^{17}$ cm⁻³, for example. Therefore, boron is pushed out by phosphorus, and a PN junction plane 42 between the N⁻-type well diffusion layer 12 and the low concentration P⁻-type diffusion layer 19 is shifted toward the source. By shifting the PN junction plane 42 between the N⁻-type well diffusion layer 12 and the low concentration P⁻-type diffusion layer 19 toward the source, the equipotential lines, which are distributed from the source-side end of the LOCOS oxide film 18 toward the drain in the conventional structure as shown in FIG. 13, are distributed from an end of the LOCOS oxide film 18 opposing the P⁺-type source diffusion layer 13 to an interface between the PN junction plane 42 and the high concentration N-type buried diffusion layer 41 in the semiconductor device of Embodiment 2, as shown in FIG. 5. As a result, the electric field concentrated at the end of the LOCOS oxide film 18 opposing the P⁺-type source diffusion layer 13 is relaxed, and the improvement in breakdown voltage can be achieved in the same manner as in the semiconductor device of Embodiment 1. Further, with the presence of the P-type surface diffusion layer 20 formed over the whole bottom surface of the gate oxide film 16, the threshold voltage can be reduced.

The same advantage can be obtained even when the substrate 11 is made of an N-type semiconductor substrate or an N⁻-type epitaxial layer. Thus, the semiconductor device of Embodiment 2 allows providing a P-channel MOS transistor with low threshold voltage and a good breakdown voltage characteristic.

Embodiment 3

Hereinafter, a semiconductor device according to Embodiment 3 of the present invention will be described with reference to the accompanying drawings.

Figure 6:
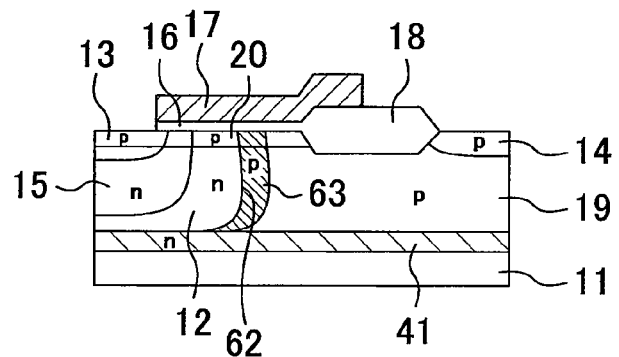
FIG. 6 is a cross-sectional view illustrating a principle part of a high breakdown voltage P-channel MOS transistor which is a semiconductor device according to Embodiment 3 of the present invention.
Figure 7:
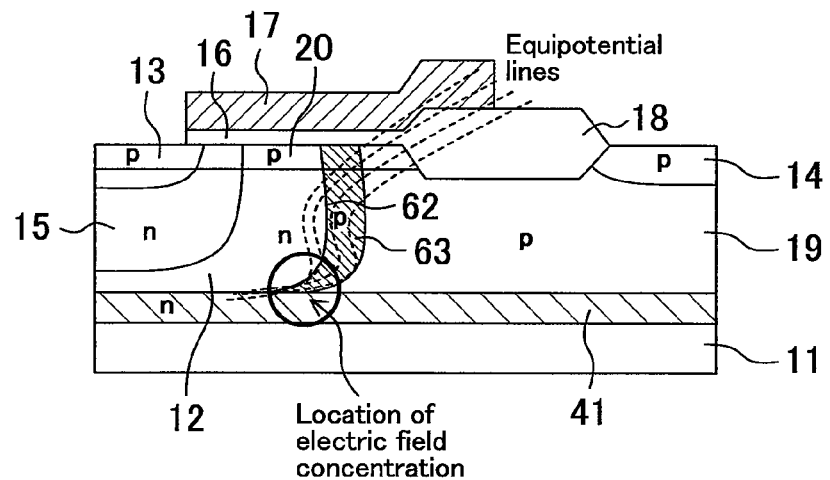
FIG. 7 is a cross-sectional view of the semiconductor device of Embodiment 3, illustrating equipotential lines and a location of electric field concentration near an interface between a low concentration P⁻-type diffusion layer and other layers.

FIG. 6 is a cross-sectional view illustrating a principle part of a high breakdown voltage P-channel MOS transistor which is a semiconductor device according to Embodiment 3 of the present invention, and FIG. 7 is a cross-sectional view of the semiconductor device of Embodiment 3, illustrating equipotential lines and a location of electric field concentration near an interface between the low concentration P⁻-type diffusion layer 19 and other layers. In FIGS. 6 and 7, the same components as those of the semiconductor device of Embodiment 1 shown in FIG. 1 are indicated by the same reference numerals.

As shown in FIG. 6, the semiconductor device of Embodiment 3 includes: a p-type substrate 11; an N⁻-type well diffusion layer 12; an N⁻-type well diffusion layer 15; a P⁺-type source diffusion layer 13; a low concentration P⁻-type diffusion layer 19; a P-type surface diffusion layer 20; a LOCOS oxide film 18; a P⁺-type drain diffusion layer 14; a gate oxide film 16; and a gate electrode 17. In the semiconductor device of Embodiment 3, the N⁻-type well diffusion layer 12 is formed on the source side of the low concentration P⁻-type diffusion layer 19.

The semiconductor device of Embodiment 3 further includes, like the semiconductor device of Embodiment 2, a high concentration N-type buried diffusion layer 41 formed in an upper portion of the substrate 11 to be in contact with the bottoms of the N⁻-type well diffusion layer 12 and the low concentration P⁻-type diffusion layer 19. The high concentration N-type buried diffusion layer 41 has an impurity concentration of about $1\times10^{17}$ cm⁻³ to $3\times10^{17}$ cm⁻³, for example, and is arranged at least below the gate electrode 17 to have a length not smaller than the gate length.

The semiconductor device of Embodiment 3 further includes a low concentration P⁻-type buffer diffusion layer 63 formed in a region between the N⁻-type well diffusion layer 12 and the low concentration P⁻-type diffusion layer 19 to extend from the gate oxide film 16 to the high concentration N-type buried diffusion layer 41. The low concentration P⁻-type buffer diffusion layer 63 is in contact with the source-side end of the low concentration P⁻-type diffusion layer 19, and contains p-type impurities at a concentration sufficiently lower than that in the low concentration P⁻-type diffusion layer 19 for electric field relaxation. In FIG. 6, reference numeral 62 denotes a PN junction plane formed between the N⁻-type well diffusion layer 12 and the low concentration P⁻-type buffer diffusion layer 63. The structure of the present embodiment other than this is the same as that of Embodiment 1.

In the semiconductor device of Embodiment 3, like the semiconductor device of Embodiment 1, the low concentration P⁻-type buffer diffusion layer 63 is formed on the source side of the low concentration P⁻-type diffusion layer 19. Therefore, the electric field concentration at the end of the LOCOS oxide film 18 opposing the P⁺-type source diffusion layer 13 can be relaxed. Further, like in the semiconductor device of Embodiment 2, the high concentration N-type buried diffusion layer 41 is formed below the N⁻-type well diffusion layer 12 and the low concentration P⁻-type diffusion layer 19 to be in contact with them. Therefore, the location of electric field concentration can be shifted below the high concentration N-type buried diffusion layer 41. This allows significant improvement in breakdown voltage and reduction in threshold voltage.

According to the structure of the present embodiment, the breakdown voltage, which has been about 23 V in the conventional structure in reducing the threshold voltage, can be improved to about 27 V, and the threshold voltage can be reduced to about −0.7 V.

Next, a method for manufacturing the semiconductor device of Embodiment 3 will schematically be described. FIGS. 9A to 9G are cross-sectional views illustrating the processes of manufacturing the semiconductor device of Embodiment 3.

First, in the process shown in FIG. 9A, a LOCOS oxide film 18 is formed by LOCOS oxidation on a substrate 11 made of a P-type semiconductor.

Then, in the process shown in FIG. 9B, a high concentration N-type buried diffusion layer 41 is formed by implanting phosphorus 91 as an N-type impurity, for example, by general ion implantation at an acceleration energy increased so as not to distribute the ions in the surface portion.

Then, in the process shown in FIG. 9C, an N⁻-type well diffusion layer 12 is formed by implanting an N-type impurity into part of the substrate 11 above the high concentration N-type buried diffusion layer 41 by ion implantation using an implantation mask 92 formed by general photolithography. In this process, phosphorus ions 93, for example, are implanted.

In the process shown in FIG. 9D, the implantation mask 92 is removed, and then an N⁻-type well diffusion layer 15 is formed by implanting an N-type impurity into an upper portion of the N⁻-type well diffusion layer 12 by ion implantation using an implantation mask 94 formed by photolithography. In this process, phosphorus ions 95, for example, are implanted.

In the process shown in FIG. 9E, the implantation mask 94 is removed, and then a low concentration P⁻-type diffusion layer 19 is formed by implanting a P-type impurity into part of the substrate 11 above the high concentration N-type buried diffusion layer 41 by ion implantation using an implantation mask 97 formed by photolithography. In this process, boron ions 96, for example, are implanted.

In the process shown in FIG. 9F, the implantation mask 97 is removed, and then a low concentration P⁻-type buffer diffusion layer 63 is formed in part of the substrate 11 above the high concentration N-type buried diffusion layer 41 and between the N⁻-type well diffusion layer 12 and the low concentration P⁻-type diffusion layer 19 by ion implantation using an implantation mask 98 formed by photolithography. In this process, boron ions 99, for example, are implanted. When the width of the low concentration P⁻-type buffer diffusion layer 63 in the gate length direction is controlled to be not smaller than a margin for mask misalignment in the process of forming the diffusion layer, variation in breakdown voltage caused by mask misalignment can be suppressed.

In the process shown in FIG. 9G, the implantation mask 98 is removed, and then a P-type surface diffusion layer 20 is formed in upper portions of the N⁻-type well diffusion layer 15, the N⁻-type well diffusion layer 12, the low concentration P⁻-type buffer diffusion layer 63 and the low concentration P⁻-type diffusion layer 19 by a known technology. Then, a gate oxide film 16, a P⁺-type source diffusion layer 13, a P⁺-type drain diffusion layer 14, and a gate electrode 17 are formed on the substrate 11 in this order. Through the above-described processes, the semiconductor device of Embodiment 3 can be manufactured.

The semiconductor device of Embodiment 3 described above makes it possible to form a high breakdown voltage P-channel MOS transistor having reduced threshold voltage, reduced ON resistance, and a good breakdown voltage characteristic.

Embodiment 4

Hereinafter, a semiconductor device according to Embodiment 4 of the present invention will be described with reference to the accompanying drawings.

Figure 8:
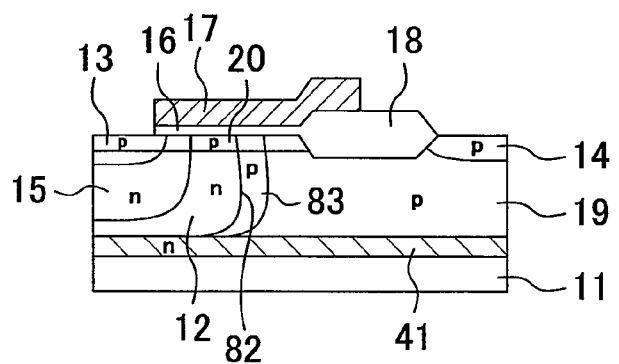
FIG. 8 is a cross-sectional view illustrating a principle part of a high breakdown voltage P-channel MOS transistor which is a semiconductor device according to Embodiment 4 of the present invention.
Figure 11:
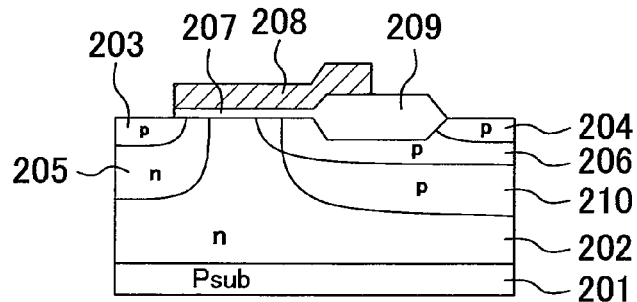
FIG. 11 is a cross-sectional view of a conventional high breakdown voltage MOS transistor.
Figure 12:
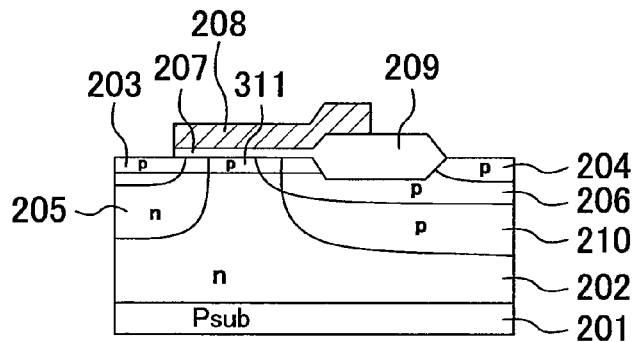
FIG. 12 is a cross-sectional view of a variant of the conventional high breakdown voltage MOS transistor.

FIG. 8 is a cross-sectional view illustrating a principle part of a high breakdown voltage P-channel MOS transistor which is a semiconductor device according to Embodiment 4 of the present invention.

In the semiconductor device of Embodiment 4, the low concentration $P^-$-type buffer diffusion layer 63 formed in the semiconductor device of Embodiment 3 is not formed. Instead of this, a P-type substrate region 83, which is part of the substrate 11, is arranged between the $N^-$-type well diffusion layer 12 and the low concentration $P^-$-type diffusion layer 19. An impurity concentration of the P-type substrate region 83 is almost the same as that of a lower portion of the substrate 11 in which other diffusion layers are not formed.

With the presence of the region containing the low concentration P-type impurity on the source side of the low concentration $P^-$-type diffusion layer 19 to be in contact with the low concentration $P^-$-type diffusion layer 19, the electric field concentration at the end of the LOCOS oxide film 18 opposing the $P^+$-type source diffusion layer 13 can be relaxed, in the same manner as in the semiconductor device of Embodiment 3.

Further, like in the semiconductor device of Embodiment 2, the high concentration N-type buried diffusion layer 41 is formed below the $N^-$-type well diffusion layer 12 and the low concentration $P^-$-type diffusion layer 19 to be in contact with them. Therefore, the location of electric field concentration can be shifted below the high concentration N-type buried diffusion layer 41. This allows significant improvement in breakdown voltage and reduction in threshold voltage.

In the semiconductor device of Embodiment 4, the process for forming the low concentration $P^-$-type buffer diffusion layer 63 can be omitted. Therefore, as compared with the semiconductor device of Embodiment 3, cost of semiconductor chips can be reduced, and the reduction in threshold voltage, the improvement in breakdown voltage, and the reduction in ON resistance can be achieved in the same manner as in the semiconductor device of Embodiment 3.

Next, a method for manufacturing the semiconductor device of Embodiment 4 will schematically be described. FIGS. 10A to 10F are cross-sectional views illustrating the processes of manufacturing the semiconductor device of Embodiment 4.

First, in the processes shown in FIGS. 10A to 10E, the LOCOS oxide film 18 is formed on the substrate 11, and the high concentration N-type buried diffusion layer 41, the $N^-$-type well diffusion layer 12, the $N^-$-type well diffusion layer 15, and the low concentration $P^-$-type diffusion layer 19 are formed in the substrate 11 in this order by the same processes of Embodiment 3 shown in FIGS. 9A to 9E. In this case, impurity ions are not implanted into part of the substrate 11 above the high concentration N-type buried diffusion layer 41 and between the $N^-$-type well diffusion layer 12 and the low concentration $P^-$-type diffusion layer 19 (the P-type substrate region 83).

Then, in the process shown in FIG. 10F, in the same manner as described in Embodiment 3, the P-type surface diffusion layer 20, the gate oxide film 16, the gate electrode 17, the $P^+$-type source diffusion layer 13, and the $P^+$-type drain diffusion layer 14 are formed to obtain a high breakdown voltage P-channel MOS transistor.

As described above, in the semiconductor device of Embodiment 4, part of the substrate 11 is used as the low concentration $P^-$-type buffer diffusion layer 63. Therefore, the number of processes for manufacturing the semiconductor device can be reduced as compared with Embodiment 3, and the semiconductor device can be provided with reduced threshold voltage, reduced ON resistance, and a good breakdown voltage characteristic.

The examples of the semiconductor device and the manufacturing method thereof described above are applicable to various devices that require high breakdown voltage operation.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. A semiconductor device comprising:
    a semiconductor substrate;
    a first well diffusion layer of a first conductivity type formed in an upper portion of the semiconductor substrate;
    a second well diffusion layer of the first conductivity type formed in an upper portion of the first well diffusion layer;
    a source diffusion layer of a second conductivity type formed in an upper portion of the second well diffusion layer;
    a third well diffusion layer of the second conductivity type formed in an upper portion of the semiconductor substrate to be positioned away from the second well diffusion layer, and forms a PN junction with the first well diffusion layer;
    a drain diffusion layer of the second conductivity type formed in an upper portion of the third well diffusion layer;
    a gate insulating film formed on the second well diffusion layer, the first well diffusion layer, and the third well diffusion layer;
    a gate electrode formed on the gate insulating film;
    a device isolation insulating film formed on the third well diffusion layer and between the gate insulating film and the drain diffusion layer to be connected to the gate insulating film; and
    a buried diffusion layer of the first conductivity type formed in part of the semiconductor substrate in contact with the bottoms of both of the first well diffusion layer and the third well diffusion layer.

2. The semiconductor device of claim 1, further comprising:
a surface diffusion layer of the second conductivity type formed in surface portions of the second well diffusion layer, the first well diffusion layer, the buffer layer and the third well diffusion layer immediately below the gate insulating film.

3. The semiconductor device of claim 1, wherein the first well diffusion layer is positioned closer to the source diffusion layer than the third well diffusion layer.

4. The semiconductor device of claim 1, further comprising:
a buffer layer of the second conductivity type formed between the first well diffusion layer and the third diffusion layer to be in contact with an end of the third well diffusion layer opposing the source diffusion layer.

5. The semiconductor device of claim 4, wherein the buffer layer is made of the same material as the semiconductor substrate and contains an impurity of the second conductivity type at substantially the same concentration as the impurity concentration in the semiconductor substrate.

6. The semiconductor device of claim 4, wherein the buffer layer contains the impurity of the second conductivity type at a higher concentration than the impurity concentration in the semiconductor substrate.

7. The semiconductor device of claim 4, wherein the buffer layer of the second conductivity type extends from immediately below the gate insulating film to a position deeper than a peak of curvature of impurity concentration distribution of the third well diffusion layer, and the buffer layer has an impurity concentration lower than an impurity concentration in the third well diffusion layer.

* * * * *